United States Patent

Kitano

[11] Patent Number: 6,072,731
[45] Date of Patent: Jun. 6, 2000

[54] SEMICONDUCTOR MEMORY CIRCUIT

[75] Inventor: Tomohiro Kitano, Kanagawa, Japan

[73] Assignee: NEC Corporation, Tokyo, Japan

[21] Appl. No.: 09/178,831

[22] Filed: Oct. 26, 1998

[30] Foreign Application Priority Data

Oct. 27, 1997 [JP] Japan ................................. 9-294577

[51] Int. Cl.$^7$ ........................................... G11C 7/00
[52] U.S. Cl. ...................... 365/190; 365/203; 365/204
[58] Field of Search .................................. 365/190, 203, 365/230.06, 204

[56] References Cited

U.S. PATENT DOCUMENTS

| 5,491,453 | 2/1996 | Mun et al. | 365/203 |
| 5,805,515 | 9/1998 | Suzuki | 365/203 |

FOREIGN PATENT DOCUMENTS 2-9086  1/1990  Japan .

*Primary Examiner*—Vu A. Le
*Attorney, Agent, or Firm*—Young & Thompson

[57] ABSTRACT

When the data read out line is in the non-selective state, the data select line is at the "L" level, and therefore, the NMOS transistor is turned on, and to the data read out line, the capacity of the condenser is added. Therefore, the potential rising of the data read out line because of the influence of the coupling capacity just after the data select line has become at the "H" level, is small. After that, the memory cell data is transmitted to the data read out line, but at this time, the NMOS transistor becomes in the off state, and therefore, the capacity of the data read out line is reduced, so that the read out speed of the data may not be affected. Consequently, the signal interference because of the coupling capacity can be reduced.

3 Claims, 7 Drawing Sheets

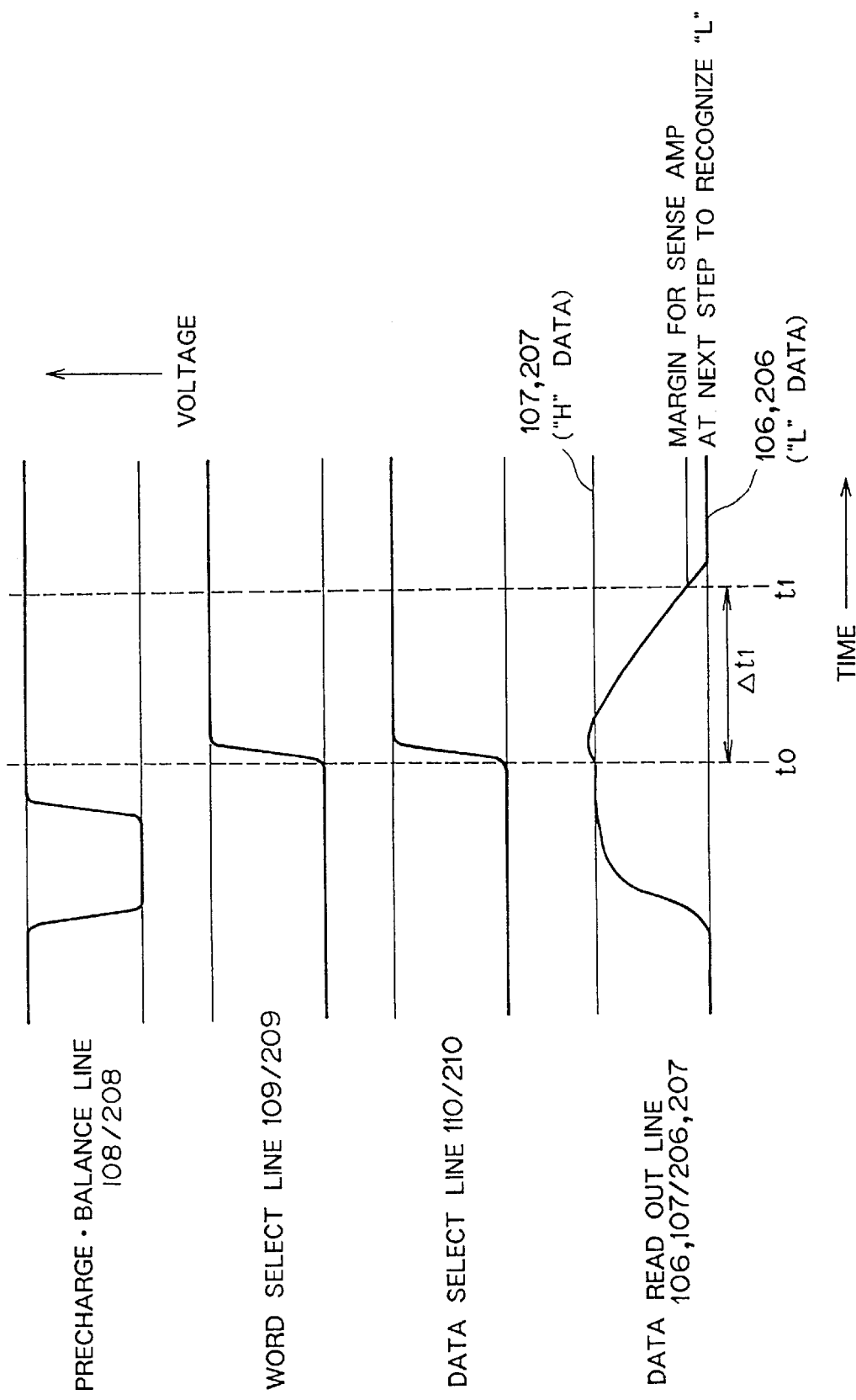

SEMICONDUCTOR MEMORY CIRCUIT

BACKGROUND OF THE INVENTION

1. Field of the Invention

The present invention relates to a semiconductor memory circuit, wherein it is attempted to prevent the degradation of read out performance because of the coupling capacity of the data line.

2. Description of the Related Art

In recent years, as the fining of the design rule of semiconductors advances, the fellow signal lines in a semiconductor chip have become easy to receive the interference by the coupling capacity.

Especially, a signal line with a fine potential change such as a data read out line of a memory cell, is easy to receive the influence of the coupling capacity generated between itself and a signal line having a large potential change and used in the peripheral circuits, and a malfunction such as a delay of read out or a reversing of the data in the worst case is caused by an influence thereof.

FIG. 1 is a circuit diagram showing an embodiment of the arrangement of a prior art semiconductor memory circuit (hereafter, referred to simply as a first prior art), and FIG. 2 is a figure of the operational wave form of the circuit shown in FIG. 1. In FIG. 1, numeral 401 is a memory cell, and numerals 402, 403 are complementary bit lines of the memory cell 401, and numerals 404, 405 and numerals 406, 407 are data read out lines, and numeral 408 is a precharge·balance line of the data read out lines, and numeral 409 is a word select line of the memory cell 401, and numeral 410 is a data select line. Furthermore, numeral 412 is a coupling capacity generated between the data read out line 406 and the data select line 410, and numeral 413 is a parasitic capacity held by the data read out line 406 itself, and numeral 414 is a parasitic capacity held by the data read out line 407 itself.

Next, the action of the above mentioned semiconductor memory circuit will be described by using FIG. 2. First, it is supposed that the bit lines 402, 403 and the data read out lines 404, 405, 406, 407 is initialized to be at "H" (high) level, by making the precharge·balance line 408 be at "L" (low) level. Furthermore, it is supposed that a sense amp active signal 421 which provides a constant current source and activates a sense amp 419 has also been activated sufficiently before the sense amp 419 operates.

If the data select line 410 is activated (becomes at "H" level) at the time t0, the potential of the data read out line 406 is raised by the coupling capacity 412, since the data select line 410 is a signal with a large potential change. If the word select line 409 is activated at the same time, the bit lines 402, 403 generate a level difference of "H" level and "L" level in accordance with the data held by the memory cell 401. Then, through PMOS transistors 415, 416 which have become in the on state by the activation of the data select line 410, the level of the bit lines 402, 403 is transmitted to the data read out lines 404, 405, and further, through bipolar transistors 417, 418, the data of the data read out lines 404, 405 is transmitted to the data read out lines 406, 407.

However, in the data read out line 406, the potential is raised to be higher than the potential in the initial state, when the data select line 410 is changed to be at "H" level because of the influence of the coupling capacity 412 between itself and the data select line 410. Therefore, even in the case where the data read out line 406 receives "L" data and the data read out line 407 receives "H" data, the potential of the read out line 406 is higher than the potential of the data read out line 407 just after the reception of the data, and the time Δt2 for the potential of the data read out line 406 to fall down to the potential at which the data of the data readout line 406 is recognized to be "L" data by the sense amp 419 at the next step, is long, and consequently, there has been such a problem that the time to perform a normal output is delayed.

Therefore, another embodiment of arrangement of a semiconductor memory circuit which has been thought out for improving the read out time, is shown in FIG. 3 (hereafter, referred to simply as a second prior art). FIG. 4 is a figure of the operational wave form of the circuit shown in FIG. 3. This second prior art is described in the patent publication (Japanese Patent Application Laid-Open No. 2-9086), and is an art wherein a shield line 622 as the earth potential is added for the measure of coupling.

Next, the action of the above mentioned semiconductor memory circuit will be described by using FIG. 4. Similarly to the previous prior art embodiment 1, if a data select line 610 and a word select line 609 are activated at the time t0, bit lines 602, 603 generate a level difference of "H" level and "L" level in accordance with the data held by a memory cell 601. Then, through PMOS transistors 615, 616 which have become in the on state by the activation of the data select line 610, the level of the bit lines 602, 603 is transmitted to data read out lines 604, 605, and further, the data of the data read out lines 604, 605 is transmitted to data read out lines 606, 607 through bipolar transistors 617, 618.

Here, the data read out line 606 is not affected by the coupling capacity of the data select line 610 because of a shield line 622, and even in the case where the data received by the data read out line 606 is "L" data, the time Δt3 for the potential of the data read out line 606 to fall down to the potential at which the data of the data read out line 606 is recognized to be "L" data by a sense amp 619 at the next step, is shorter than Δt2 in the first prior art. Consequently, the time to perform a normal output is improved.

However, in a case where the data read out line which is easy to receive an influence of the coupling and the data select line are formed in the same process and have a plane positional relation on the semiconductor process, it is necessary to arrange shield lines between all data read out lines and data select lines, and in the place where there are a lot of signal lines and which has a complex structure and is repeatedly arranged, such as a read out circuit section near the memory cell section, the occupied area on the semiconductor chip is increased, which is unsuitable for fining.

Furthermore, the characteristic deterioration arises in other circuits or signal lines, and the obstruction arises when the integration degree of a semiconductor chip is improved.

Moreover, in the case where the data read out line and the select signal line are formed in different processes and have a positional relation of a vertical structure in the multilayer interconnection process, it is required to vertically arrange the data read out line and the select signal line so as to be separated by a shield line of another process, in order to obtain the shield effect, and there has been such a problem that the manufacturing steps are increased and the structure becomes much more complex.

SUMMARY OF THE INVENTION

An object of the present invention is to provide a semiconductor memory circuit, wherein a switch is provided to a data line which is easier to receive the influence of the coupling, among the data lines to transmit the data of a memory cell, and by controlling the switch with a data select signal to add a capacity to the data line, the delay of the data read out time is decreased, and further, no shield line is used, and consequently, it is attempted to prevent the deterioration of the characteristics of a signal line, the increase of the manufacturing steps, the lowering of the integration degree of a semiconductor chip because of the complexity of the structure, and the like.

The semiconductor memory circuit according to the present invention, comprises: a plurality of memory cells; complementary data read out lines by which data of said memory cells is read out; a data select line for selecting said memory cells from which data is read out; switch means one end of which is connected to said data read out lines and which is controlled to be on and off by a signal of said data select line; and a capacity which is put between the other end of said switch means and the earth.

In this semiconductor memory circuit, it can be arranged that said switch means comprises a first transistor and a second transistor respectively connected to said complementary data read out lines, and that said capacity comprises a first capacity and a second capacity respectively put between each of the other ends of said first and second transistors and the earth.

Furthermore, it can be arranged that said switch means comprises a first transistor and a second transistor respectively connected to said complementary data read out lines, and that said capacity comprises a third capacity commonly put between each of the other ends of said first and second transistors and the earth.

According to the present invention, only by adding a switch means and a capacity, the potential rising of the data read out line by the coupling generated because of the arranging method of the elements, is decreased, so that an effect to prevent the delay of the data read out time can be obtained.

Furthermore, since the signal to control said switch means is a data select line used in the peripheral circuit, it is unnecessary to add anther control signal, and accordingly, it is sufficient to add the small scale elements, when compared with the shield line used in the second prior art, and therefore, it is suitable also for fining, and the manufacturing steps are also not increased, and the application near the complex circuits is also possible, and further, such effects that there is also no limit to the arrangement of the surrounding wiring and that the deterioration of the characteristics of the surrounding circuits can be prevented, are obtained.

BRIEF DESCRIPTION OF THE DRAWINGS

FIG. 7 is a figure of an operational wave form of the semiconductor memory circuit of the first embodiment shown in FIG. 5.

DESCRIPTION OF THE PREFERRED EMBODIMENT

Figure 5:
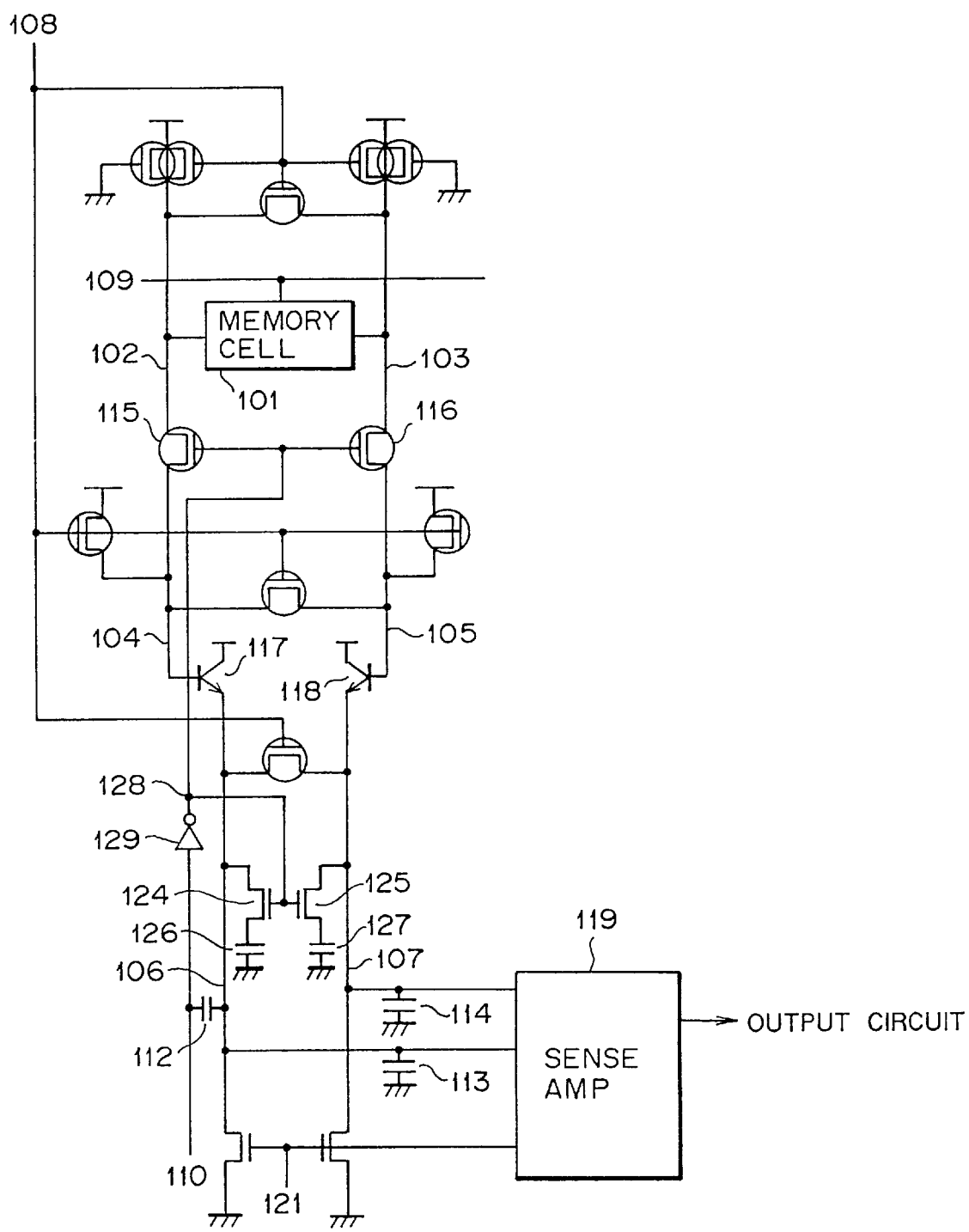
FIG. 5 is a circuit diagram of a semiconductor memory circuit according to a first embodiment of the present invention.

The preferred embodiment of the present invention will be described below by referring to the attached drawings. FIG. 5 is a circuit diagram showing the arrangement of a semiconductor memory circuit according to a first embodiment of the present invention. In this figure, numeral 101 is a memory cell, and numerals 102, 103 are complementary bit lines of the memory cell 101, and numerals 104, 105 and numerals 106, 107 are data read out lines, and numeral 108 is a precharge balance line of the data read out lines, and numeral 109 is a word select line of the memory cell 101, and numeral 110 is a data select line. Furthermore, numeral 112 is a coupling capacity generated between the data read out line 106 and the data select line 110, and numeral 113 is a parasitic capacity held by the data read out line 106 itself, and numeral 114 is a parasitic capacity held by the data read out line 107 itself. Then, condensers 126, 127 are connected from the data read out lines 106, 107 through NMOS transistors 125, 126. The gate inputs of the NMOS transistors 124, 125 are performed from a signal 128 which is reversed by the data select line 110 with an inverter 129.

FIG. 7 is a figure of an operational wave form of the embodiment shown in FIG. 5. First, it is supposed that the bit lines 102, 103 and the data read out lines 104, 105, 106, 107 are initialized to be at "H" level, by making the precharge balance line 108 be at "L" level. Furthermore, in the initial state, the data select line 110 is inactive ("L" level), and therefore, the reversed signal 128 of the data select line 110 is at "H" level, and the NMOS transistors 124, 125 are in the on state. Therefore, a state where the capacity held by the condensers 126, 127 is added to the data read out lines 106, 107, arises. Then, it is supposed that a sense amp activating signal 121 which provides a constant current source and activates a sense amp 119, has also been activated sufficiently before the sense amp 119 operates.

If the data select line 110 is activated (becomes at "H" level) at the time t0, the potential of the data read out line 106 is raised by the coupling capacity 112, since the data select line 110 is a signal having a large potential change. However, since the capacity held by the condenser 126 is added to the data readout line 106, the potential rising amount of the data read out line 106 because of the coupling capacity 112, is reduced when compared with that in the case of no condenser 126. After that, when the signal 128 becomes the reversed value of the data select line 110 by the inverter 129, the reversed signal 128 of the data select line 110 becomes at "L" level, and the NMOS transistors 124, 125 become in the off state, and the capacity of the data read out lines 106, 107 is reduced by the capacity held by the condensers 126, 127.

If the word select line 109 is activated at the same time that the data select line 110 is activated, the bit lines 102, 103 generate a level difference of "H" level and "L" level in accordance with the data stored by the memory cell 101. Then, through PMOS transistors 115, 116 which have become in the on state by the activation of the data select line 110, the level of the bit lines 102, 103 is transmitted to the data read out lines 104, 105, and further, through bipolar transistors 117, 118, the data of the data read out lines 104, 105 is transmitted to the data read out lines 106, 107.

Here, when the data of the data read out lines 104, 105 is transmitted to the data read out lines 106, 107, the condensers 126, 127 do not become the factor to delay the transmission of the data, since the capacity held by the condensers 126, 127 is separated in the data read out lines 106, 107.

Then, even in the case where the data received by the data read out line 106 is the "L" data, the time Δt1 for the potential of the data read out line 106 to fall down to the potential at which the data of the data read out line 106 is recognized to be the "L" data by the sense amp 119 at the next step, is short, since the potential rising amount of the data read out line 106 because of the influence of the coupling capacity 112 between itself and the data read out line 110, is small. Consequently, the time from the activation of the word select line 109 and the data select line 110 to the performing of the normal output, is improved.

Figure 1:
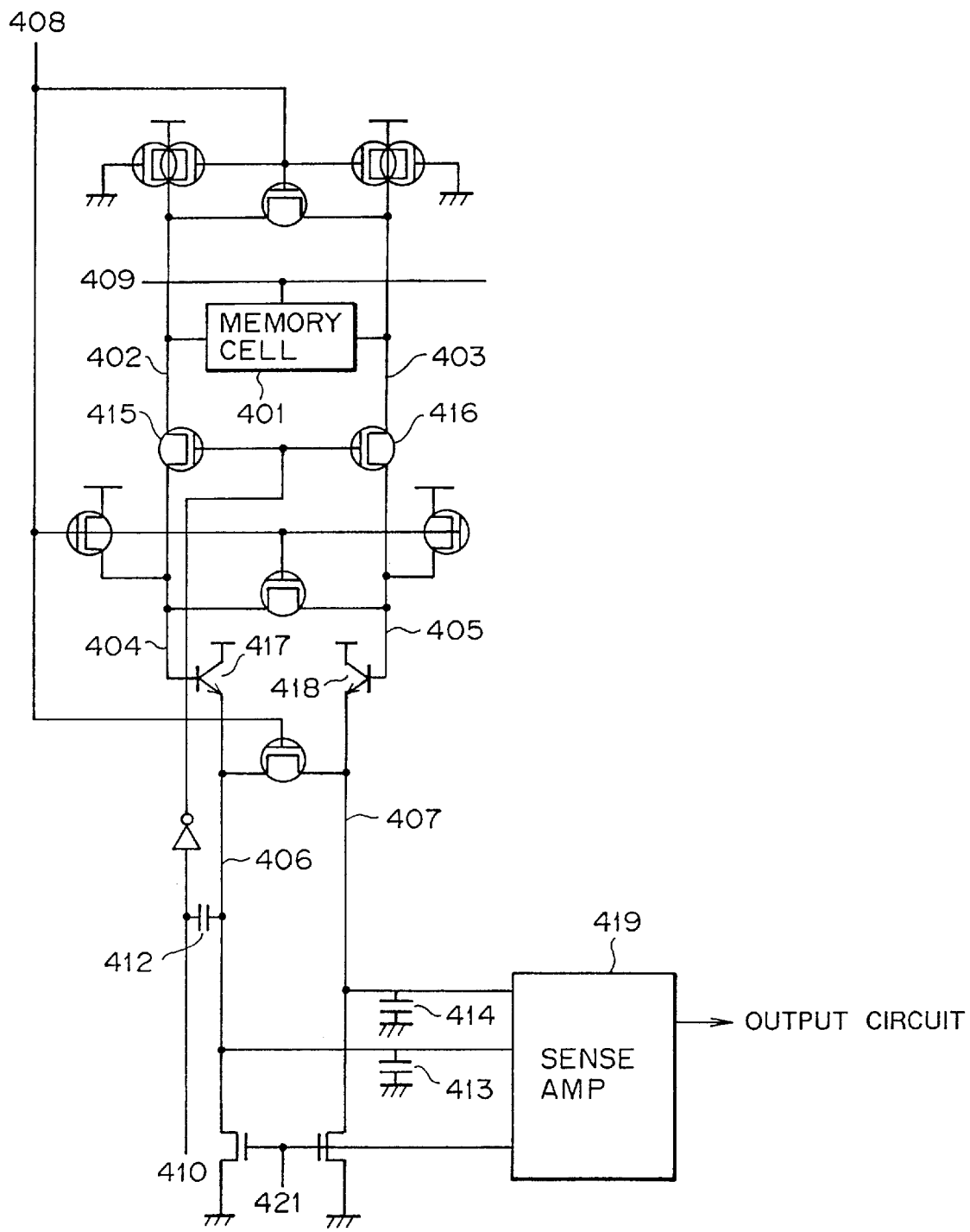
FIG. 1 is a circuit diagram of a semiconductor memory circuit according to a first prior art.
Figure 2:
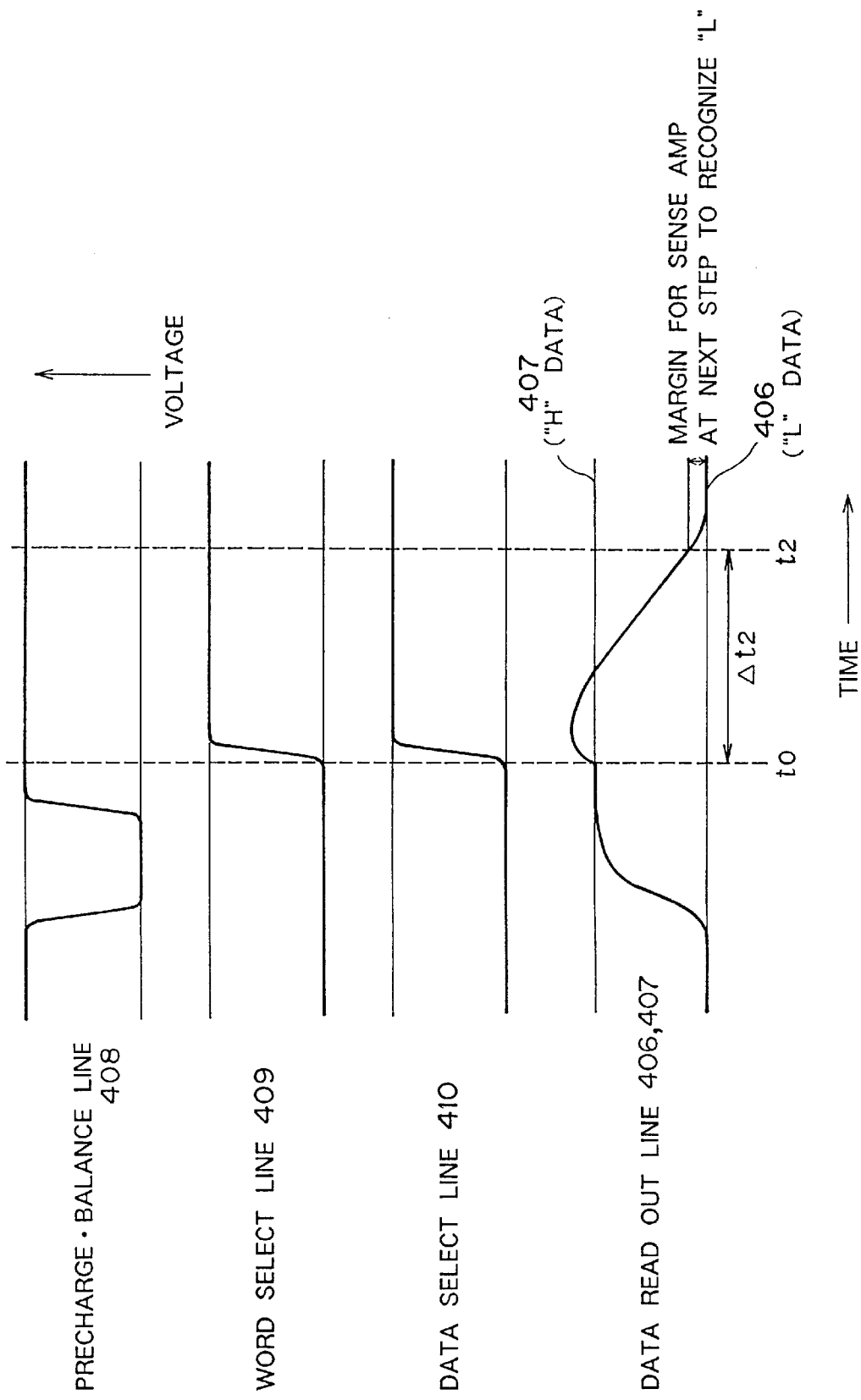
FIG. 2 is a figure of an operational wave form of the semiconductor memory circuit shown in FIG. 1.

Next, the effect of the first embodiment of the present invention will be described by concretely comparing it with that of the first prior art (FIG. 1).

In FIG. 1, letting the capacity value of the parasitic capacity 413 be Ca4, and the capacity value of the coupling capacity 412 be Cc4, and the potential rising amount of the data read out line 406 which is caused by the influence of the coupling capacity 412 when the data select line 410 changes by ΔVs4 [V] be ΔV4 [V], this ΔV4 is expressed by the following expression 1:

$$\Delta V4 = (Cc4/Ca4)\Delta Vs4 \qquad (1)$$

Here, when Ca4=0.2 [pF] and Cc4=0.002 [pF], ΔV4=30 [mV], since Vs4=3 [V], when the potential of the data select line 410 changes from 0 [V] to 3 [V].

In FIG. 5 showing the first embodiment of the present invention, letting the capacity value of the parasitic capacity 113 be Ca1, and the capacity value of the coupling capacity 112 be Cc1, and the capacity value of the condenser 126 connected through the switch 124 be Cb1, and the potential rising amount of the data read out line 106 which is caused by the influence of the coupling capacity 112 when the data select line 110 changes by ΔVs1 [V] be ΔV1 [V], the ΔV1 is expressed by the following expression 2:

$$\Delta V1 = \{Cc1/(Ca1+Cb1)\}\Delta Vs1 \qquad (2)$$

Here, when Ca1=0.2 [pF], Cc1=0.002 [pF], and Cb1=1 [pF], ΔV1=5 [mV], since ΔVs1=3 [V], when the potential of the data select line 110 changes from 0 [V] to 3 [V].

In the case where the data read out line receives the "L" data, the decrease of potential is performed until it moves to the "L" data, but, if the time of 10 [ps] per 1 [mV] is necessary for this decrease of potential, the time for the sense amp 119 at the next step to recognize the "L" data is shorter than that of the prior art embodiment 1 by 250 [ps], since the potential rising amount of the data read out line 106 in one embodiment of the present invention is reduced by 25 [mV] when compared with that of the prior art embodiment 1. Consequently, the read out time until the data is output, is reduced.

Figure 3:
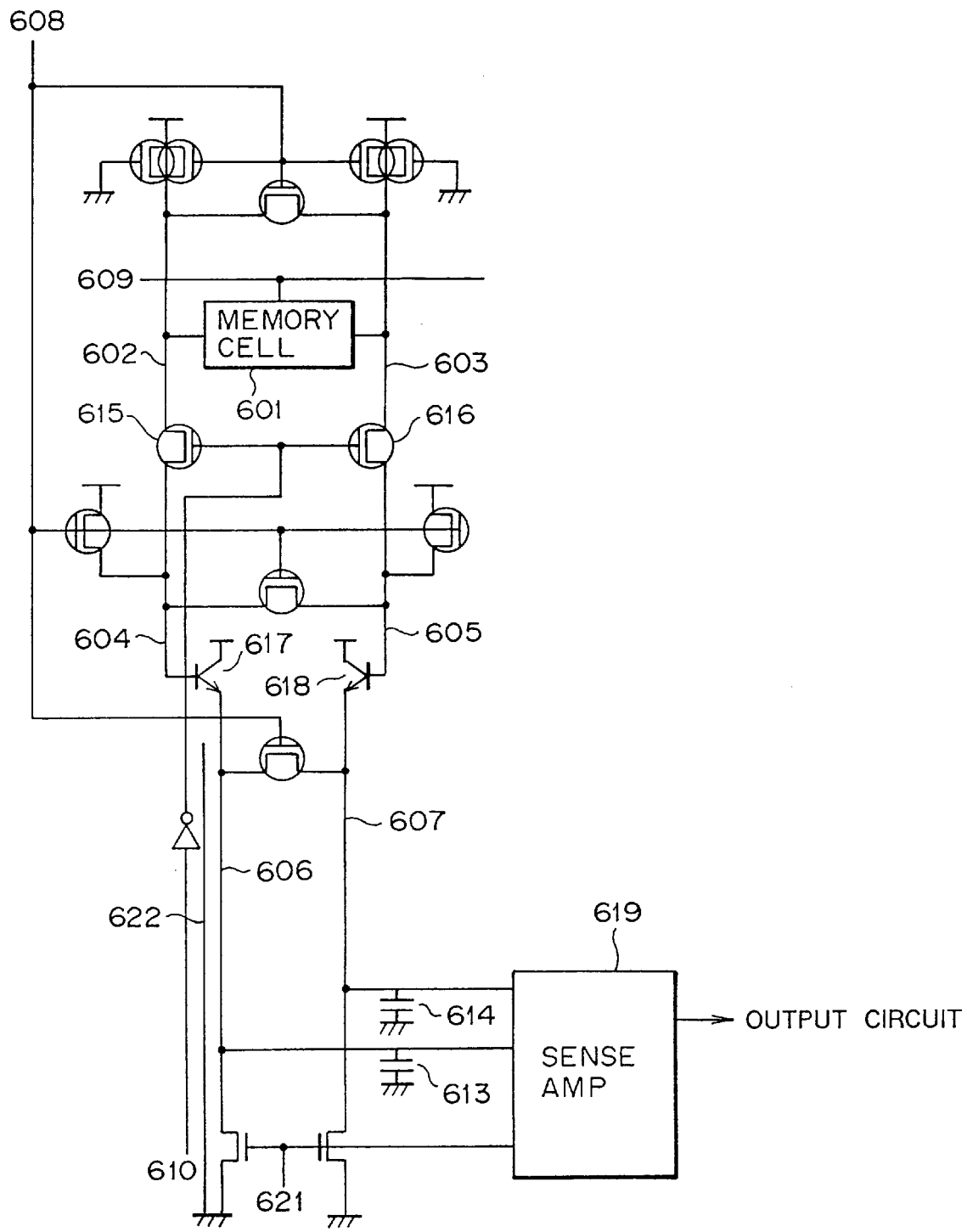
FIG. 3 is a circuit diagram of a semiconductor memory circuit according to a second prior art.
Figure 4:
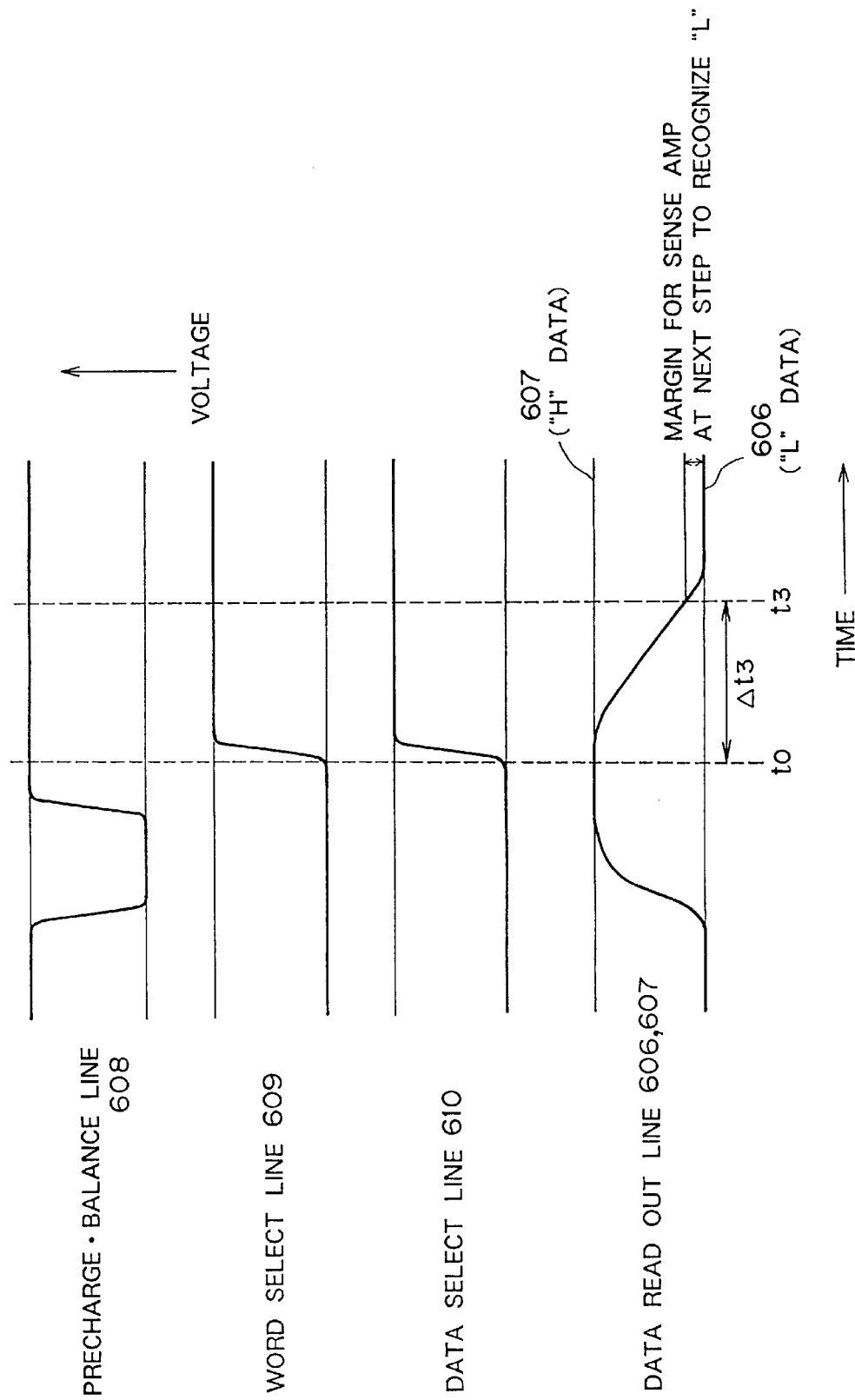
FIG. 4 is a figure of an operational wave form of the semiconductor memory circuit shown in FIG. 3.

Under the same condition, the first embodiment of the present invention and the second prior art (FIG. 3) will be compared. In the second prior art, the data read out line 606 is not affected by the coupling capacity, so that the potential rising may not arise. On the other hand, in the data read out line 106 of the first embodiment of the present invention, a potential rising of 5 [mV] arises, so that the time for the sense amp 119 at the next step to recognize the "L" data may be longer than that of the second prior art by 50 [ps].

However, it is necessary to arrange a shield line of a fixed potential in the second prior art, and therefore, for embodiment, in the case where the wiring is formed in the same process, it is necessary to arrange 3 pieces of lines: the data line, the data select line, and the shield line in parallel. Therefore, a wiring area for 1 more piece of line is required when compared with that of one embodiment of the present invention.

Letting the width of wiring be W [μm], the interval of wiring be S [μm], and the length of wiring be L [μm], a wiring area of (3 W+2 S)×L [μm$^2$] is necessary for every 1 set of complementary data read out lines connected to the sense amp 619, in the second prior art.

In the first embodiment of the present invention, the shield line is not used, so that a wiring area of (2 W+S)×L [μm$^2$] may be sufficient. Here, if the width of wiring W and the interval of wiring S are equal, the wiring area is an area of 5 W×L [μm$^2$] in the second prior art, and the wiring area is an area of 3 W×L [μm$^2$] in one embodiment of the present invention, so that in one embodiment of the present invention, the circuit may be arranged by an area of ⅗ of that of the prior art embodiment 2.

Usually, a semiconductor memory circuit has a lot of sense amps, and for embodiment, in the case of an arrangement of 9 inputs/outputs×32 blocks, this invention can be applied at the previous steps of 288 pieces of sense amps, and at this time, if the width of wiring W=1 [μm], the interval of wiring S=1 [μm], and the length of wiring L=100 [μm], a semiconductor chip area of (W+S)×L×288=57,600 [μm$^2$] can be reduced.

Figure 6:
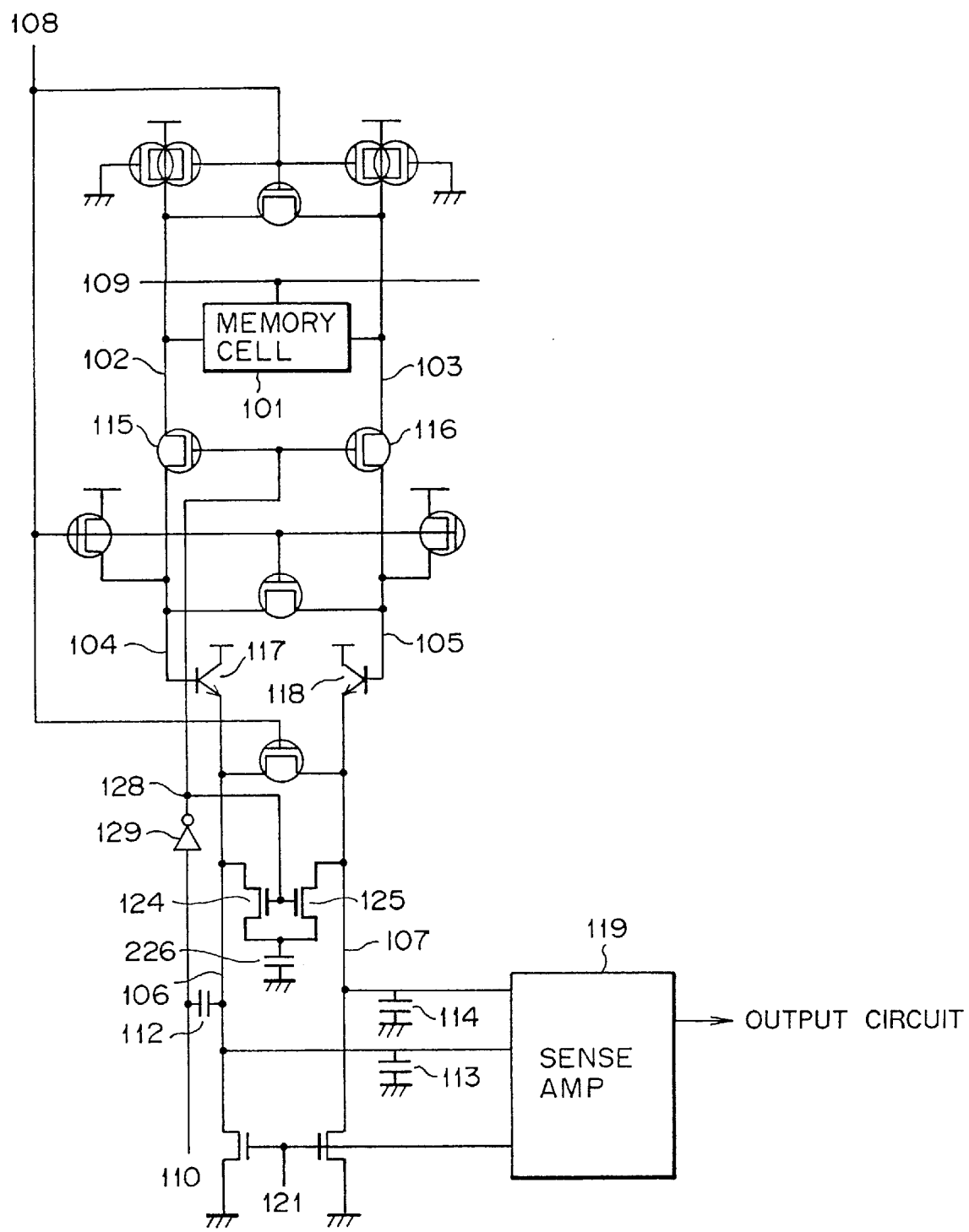
FIG. 6 is a circuit diagram of a semiconductor memory circuit according to a second embodiment of the present invention.

Furthermore, according to said first embodiment, as shown in FIG. 5, one piece of condenser 126, 127 is each connected to one piece of data read out line, but as shown in FIG. 6, a circuit having a function equal to that of said first embodiment can be arranged, even if one piece of condenser 226 is connected to a plurality of data read out lines. FIG. 6 is a circuit diagram showing the second embodiment of the present invention in which one piece of condenser 226 is connected to two pieces of data read out lines. In FIG. 6, the same numerals are given to the components equal to those in FIG. 5, and the detailed description thereof will be omitted.

What is claimed is:

1. A semiconductor memory circuit comprising:
 a plurality of memory cells;
 complementary data read out lines by which data of said memory cells is read out;
 a data select line which selects said memory cells to read out the data;
 switch means one end of which is connected to said data read out lines and which is controlled to be on/off by a signal of said data select line; and
 a capacity which is put between the other end of said switch means and the earth.

2. The semiconductor memory circuit described in claim 1, wherein said switch means comprises a first transistor and a second transistor which are connected to each of said complementary data read out lines, and wherein said capacity comprises a first capacity and a second capacity which are respectively put between each of the other ends of said first and second transistors, and the earth.

3. The semiconductor memory circuit described in claim 1, wherein said switch means comprises a first transistor and a second transistor which are connected to each of said complementary data read out lines, and wherein said capacity comprises a third capacity which is commonly put between each of the other ends of said first and second transistors, and the earth.

* * * * *